United States Patent
Choi et al.

(10) Patent No.: US 7,217,669 B2
(45) Date of Patent: *May 15, 2007

(54) METHOD OF FORMING A METAL OXIDE FILM

(75) Inventors: Han-mei Choi, Seoul (KR); Sung-tae Kim, Seoul (KR); Young-wook Park, Suwon (KR); Young-sun Kim, Suwon (KR); Ki-chul Kim, Sungnam (KR); In-sung Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 92 days.

This patent is subject to a terminal disclaimer.

(21) Appl. No.: 10/888,838

(22) Filed: Jul. 12, 2004

(65) Prior Publication Data

US 2004/0259383 A1   Dec. 23, 2004

Related U.S. Application Data

(62) Division of application No. 10/131,473, filed on Apr. 25, 2002, now Pat. No. 6,800,570.

(30) Foreign Application Priority Data

Sep. 10, 2001   (KR) .............................. 2001-55468

(51) Int. Cl.
   *H01L 21/31* (2006.01)
(52) U.S. Cl. ........................ 438/785; 438/240
(58) Field of Classification Search ................ 438/785, 438/240
   See application file for complete search history.

(56) References Cited

U.S. PATENT DOCUMENTS 5,841,186 A * 11/1998 Sun et al. .................. 257/635
5,910,218 A    6/1999 Park et al. .................. 118/719
5,948,216 A *  9/1999 Cava et al. ............. 204/192.22
6,218,300 B1 * 4/2001 Narwankar et al. ......... 438/685
6,313,047 B2 * 11/2001 Hasebe et al. .............. 438/785
6,426,308 B1   7/2002 Park et al. .................. 438/785
6,461,982 B2  10/2002 DeBoer et al. ............. 438/778
6,555,394 B2 * 4/2003 Park et al. ..................... 438/3
6,720,275 B2 * 4/2004 Park et al. .................. 438/785

FOREIGN PATENT DOCUMENTS

KR   1988-45799   9/1998

* cited by examiner

*Primary Examiner*—Nathan W. Ha
*Assistant Examiner*—Mursalin B. Hafiz
(74) *Attorney, Agent, or Firm*—Harness, Dickey & Pierce, P.L.C.

(57) ABSTRACT

A method of forming a dielectric film composed of metal oxide under an atmosphere of activated vapor containing oxygen. In the method of forming the dielectric film, a metal oxide film is formed on a semiconductor substrate using a metal organic precursor and $O_2$ gas while the semiconductor substrate is exposed under activated vapor atmosphere containing oxygen, and then, the metal oxide film is annealed while the semiconductor substrate is exposed under activated vapor containing oxygen. The annealing may take place in situ with the formation of the metal oxide film, at the same or substantially the same temperature as the metal oxide forming, and/or at least one of a different pressure, oxygen concentration, or oxygen flow rate as the metal oxide forming.

22 Claims, 5 Drawing Sheets

METHOD OF FORMING A METAL OXIDE FILM

CROSS-REFERENCE TO RELATED APPLICATIONS

This is a divisional application of U.S. application Ser. No. 10/131,473 filed on Apr. 25, 2002, now U.S. Pat. No. 6,800,570 the entire contents of which are hereby incorporated by reference for which priority is claimed under 35 U.S.C. § 120; and this application claims priority of Application No. 01-55468 filed in the Republic of Korea on Sep. 10, 2001 under 35 U.S.C. § 119.

FIELD OF THE INVENTION

The present invention relates to a method of forming a metal oxide layer, and more particularly, to a method of forming a metal oxide layer, which can be used in a semiconductor device.

DESCRIPTION OF THE RELATED ART

A tantalum pentoxide ($Ta_2O_5$) film has high dielectric constant and therefore, extensive practical use as a dielectric film in a capacitor for a new generation high-density DRAM of 1 giga bit or more. In order to put a tantalum pentoxide film into practical use, its leakage current characteristics should also be good.

Generally, a tantalum pentoxide film is formed by thermal chemical vapor deposition (CVD). During the thermal CVD, a metal organic precursor, such as $Ta(OC_2H_5)_5$ as a metal source, and $O_2$ gas are used. However, impurities such as carbon and moisture may be included in the tantalum pentoxide film, which may provide a path for leakage current. Further, once the tantalum pentoxide film is formed, it is amorphous; as a result its film quality may be poor, and it may be difficult to combine with oxygen. Accordingly, electric current flowing through such a film is prone to leak, and oxygen deficiency may occur.

In a conventional method, a low-temperature oxidation annealing process is performed after a tantalum pentoxide film is formed in order to reduce a leakage current in the tantalum pentoxide film and improve the characteristics thereof as a dielectric film. Thereafter, the tantalum pentoxide film is heated at high temperature under an oxygen atmosphere to crystallize the tantalum pentoxide film and remove impurities in the tantalum pentoxide film.

According to the conventional method, a deposition process of forming a tantalum pentoxide ($Ta_2O_5$) film and a low-temperature oxidation annealing process for supplementing oxygen deficiency are individually accomplished at different process temperatures. For this reason, two chambers are needed to perform these two processes. If these two processes are to be accomplished in the same chamber, it would take a long time to stabilize the temperature of the chamber. Therefore, time is wasted and throughput decreased.

These problems of the conventional method can occur during the formation of a metal oxide film to be used as a dielectric film in a semiconductor device, as well as in a process of forming a tantalum pentoxide ($Ta_2O_5$) film.

SUMMARY OF THE INVENTION

At least one embodiment of the present invention provides a method of forming a tantalum pentoxide film, which reduces the time required for an annealing process performed to cure an oxygen deficiency occurring after the formation of the tantalum pentoxide film, thereby enhancing the film characteristics and throughput.

At least one embodiment of the present invention provides a method of forming a dielectric film, for a semiconductor device, using a metal oxide, which enhances the film characteristics and throughput.

At least one embodiment of the present invention provides a method of forming an amorphous tantalum pentoxide or dielectric film where annealing is performed in situ with the formation of the amorphous tantalum pentoxide or metal oxide film.

At least one embodiment of the present invention provides a method of forming an amorphous tantalum pentoxide or dielectric film where annealing is performed at the same or substantially the same temperature as the temperature used during the formation of the amorphous tantalum pentoxide or metal oxide film.

In at least one embodiment of the present invention the activated vapor may be one of $O_3$ gas, UV—$O_3$, $O_2$ plasma, $O_3$ plasma, and $N_2O$ plasma. In at least one embodiment of the present invention, the Ta source may be one of $Ta(OC_2H_5)_5$ and $Ta(OC_2H_5)_4OCHCH_2N(CH_3)_2$.

In at least one embodiment of the present invention, the concentration of the activated vapor during annealing is the same as or larger than the concentration of the activated vapor used during the deposition of the amorphous tantalum pentoxide film. In at least one embodiment of the present invention, $O_2$ gas as well as the activated vapor may be supplied to the substrate during the annealing. In at least one embodiment of the present invention, the annealing is performed at a temperature of 380–520° C. In at least one embodiment of the present invention, the formation of the amorphous tantalum pentoxide film and the annealing may be performed at the same or substantially the same temperature.

In at least one embodiment of the present invention, the annealing may be performed at a higher pressure than the pressure when the amorphous tantalum pentoxide film was formed. For example, the amorphous tantalum pentoxide film may be formed at a pressure of 0.1–10 Torr, and the annealing may be performed at a pressure of 0.1–50 Torr.

In at least one embodiment of the present invention, forming the amorphous tantalum pentoxide film and performing the annealing can be repeated several times until a tantalum pentoxide film is formed to a desired thickness. In at least one embodiment of the present invention, the amorphous tantalum pentoxide film can be crystallized after annealing.

At least one other embodiment of the present invention is directed to a method of forming a tantalum pentoxide film comprising: forming an amorphous pentoxide film on a substrate in a chamber in which an activated vapor atmosphere containing oxygen is maintained, using a Ta source and $O_2$ gas; and annealing the amorphous tantalum pentoxide film in-situ with the formation of the amorphous pentoxide film in an oxygen atmosphere at a lower temperature than the crystallization of tantalum pentoxide.

In yet another embodiment, the chamber can be purged while it is evacuated, between forming the amorphous tantalum pentoxide film and the annealing.

At least one other embodiment of the present invention is directed to a method of forming a dielectric film comprising: forming a metal oxide film on a substrate while the substrate is exposed to a first activated vapor containing oxygen, using a metal organic precursor; and annealing the metal oxide film in-situ with the formation of the metal oxide film while the substrate is exposed to a second activated vapor containing oxygen.

In at least one embodiment of the present invention, the metal oxide film may be one of a tantalum pentoxide film, an aluminum oxide film, a $(Ba,Sr)TiO_3$ (BST) film, and a $PbZrTiO_3$ (PZT) film.

In at least one embodiment of the present invention, during the formation of the metal oxide film, the metal organic precursor, the activated vapor, and $O_2$ gas may be supplied to the substrate. Further, in at least one embodiment of the present invention, during the annealing, the activated vapor and $O_2$ gas may be supplied to the substrate.

In at least one embodiment of the present invention, the formation of the metal oxide film and the annealing may be performed at the same or substantially the same temperature. Also, in at least one embodiment of the present invention, the formation of the metal oxide film and the annealing may be performed in the same chamber while maintaining the vacuum state of the chamber.

At least one other embodiment of the present invention is directed to a method of forming a dielectric film comprising: forming a metal oxide film on a substrate by supplying at least an metal organic precursor and an activated vapor; and annealing the metal oxide film at substantially the same temperature as the a temperature used to form the metal oxide film.

At least one other embodiment of the present invention is directed to a method of forming a dielectric film comprising: forming a metal oxide film on a substrate by supplying at least an metal organic precursor and an activated vapor, under a first pressure, a first vapor concentration, and a first vapor flow rate; and annealing the metal oxide film under a second pressure, a second vapor concentration, and a second vapor flow rate, wherein at least one of the second pressure, second vapor concentration, and second vapor flow rate is different from the first pressure, the first vapor concentration, and the first vapor flow rate used to form the metal oxide film.

According to one or more embodiments of the present invention, in order to form a dielectric film composed of a metal oxide, little or no additional time is required to stabilize the temperature of the chamber during the deposition of an amorphous dielectric film and a subsequent annealing, thereby raising throughput. Also, during the deposition of the amorphous dielectric film and the subsequent annealing, it is possible to improve deposition characteristics such as step coverage and deposition rate and electric characteristics such as leakage current characteristics by appropriately controlling the concentration of activated vapor containing oxygen and the flow rate and pressure of $O_2$ gas.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
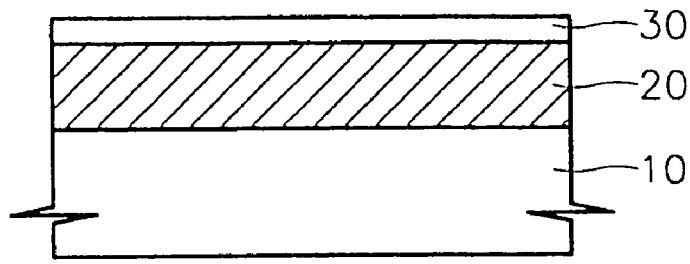
FIGS. 1 through 3 are cross-sectional views for explaining a method of forming a dielectric film according to at least one embodiment of the present invention.
Figure 2:
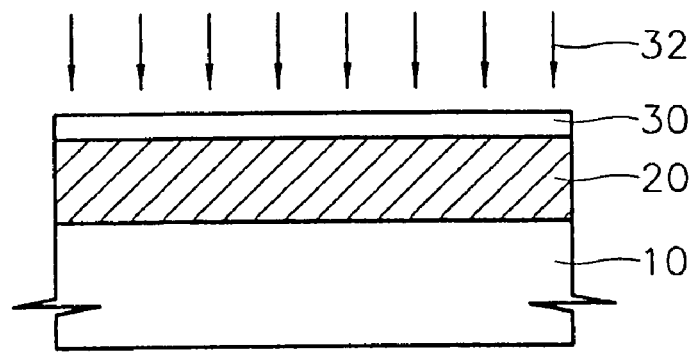
Figure 3:
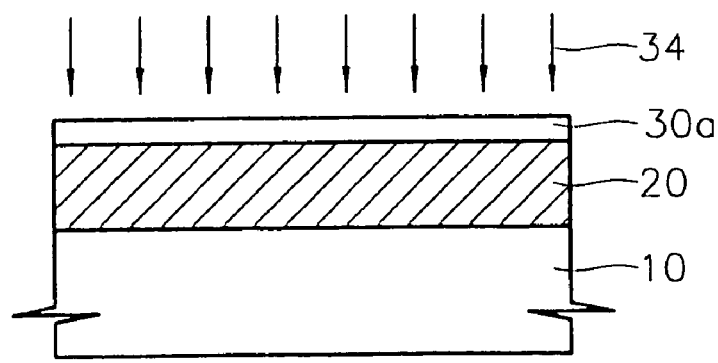

FIGS. 1 through 3 are cross-sectional views for explaining the sequence of a process of forming a dielectric film according to at least one embodiment of the present invention.

Referring to FIG. 1, a lower electrode 20 is formed on a semiconductor substrate 10, and then an amorphous dielectric film 30 is formed thereon. The amorphous dielectric film 30 may be formed by chemical vapor deposition (CVD) using a metal organic precursor as a metal source and $O_2$ gas. The amorphous dielectric film 30 may be formed of a metal oxide film such as a tantalum pentoxide film, an aluminum oxide film, a $(Ba,Sr)TiO_3$ (BST) film, a $PbZrTiO_3$ (PZT) film. The CVD may be performed in a reaction chamber included in single-wafer type adopting a resistance heater, and activated vapor containing oxygen, as well as a metal organic precursor and $O_2$ gas, is supplied to the reaction chamber during the CVD. For the activated vapor containing oxygen, $O_3$, UV—$O_3$, $O_2$ plasma, $O_3$ plasma, and/or $N_2O$ plasma may be used.

Further, $Ta(OC_2H_5)_5$ or $Ta(OC_2H_5)_4OCHCH_2N(CH_3)_2$ can be used as a Ta source when the amorphous dielectric film 30 is formed of an amorphous tantalum oxide film. The amorphous tantalum oxide film is obtained by maintaining the temperature of the reaction chamber to be about 380–520° C. (preferably, about 440–480° C.), the pressure to be about 0.1–10 Torr (preferably, about 1–3 Torr) and supplying $Ta(OC_2H_5)_5$ at a rate of about 30–40 mg/min, $O_2$ gas at a rate of about 50–1000 sccm (preferably, 50–200 sccm) and $O_3$ gas at a rate of 10–150 g/m$^3$ (preferably, 10–30 g/m$^3$). As a result, the amorphous tantalum oxide film is formed as the amorphous dielectric film 30 on the lower electrode 20.

If the amorphous dielectric film 30 is formed of an aluminum oxide film, $Al(CH_3)_3$ can be used as an aluminum source. Further, if the amorphous dielectric film 30 is formed of the BST film, $Ba(C_{11}H_{19}O_2)_2$, $\{Sr(C_{11}H_{19}O_2)_2\}_3$ $(C_{11}H_{20}O_2)$ and/or $Ti(C_3H_4O)_4$ can be supplied as metal sources. When the amorphous dielectric film 30 is formed of the PZT film, $Pb(C_{11}H_{19}O_2)$, $Zr(C_4H_9O)_4$, and/or $Ti(C_3H_7O)_4$ can be used as metal sources.

The above metal sources for the metal oxide films are, however, illustrative and are not meant to restrict the present invention. Except for the supply of the exemplified metal sources, the other conditions required in forming the respective metal oxide film may be the same as or different from those required in forming a tantalum oxide film.

After the amorphous dielectric film 30 is formed, the chamber may be purged for approximately 10–120 seconds, while maintained in a vacuum, to remove all or most of the metal sources that remain in the semiconductor substrate 10 having the amorphous dielectric film 30. At this time, $O_2$ gas can be supplied to the chamber.

Referring to FIG. 2, annealing 32 may be performed on the amorphous dielectric film 30 at about 380–520° C., which is lower than the crystallization temperature of the dielectric film 30, under activated vapor containing oxygen. The annealing 32 may be performed in the above purged chamber in-situ after the amorphous dielectric film 30 is formed, while vacuum is still maintained. To perform the annealing 32 under an oxygen atmosphere, activated vapor, such as $O_3$, UV—$O_3$, $O_2$ plasma, $O_3$ plasma and/or $N_2O$ plasma, is supplied to the chamber. During the annealing 32, the concentration of the activated vapor should be the same as or larger than that of the activated vapor supplied to the amorphous dielectric film 30, and the chamber should be maintained at a higher pressure than the pressure when forming the amorphous dielectric film 30.

When the amorphous pentoxide film is formed as the amorphous dielectric film 30, the semiconductor substrate 10 may be maintained at a temperature of about 380–520° C. (preferably, about 440–480° C.) and a pressure of about 0.1–50 Torr (preferably, about 25–35 Torr). Also, $O_2$ gas at a rate of about 50–20000 sccm (preferably, 1000–20000 sccm) and $O_3$ gas at a pressure of about 10–150 $g/m^3$ (preferably, 130–150 $g/m^3$) may be supplied to the semiconductor substrate 10. More preferably, during the annealing 32, the chamber is kept at the same or substantially the same temperature as when the amorphous dielectric film 30 is formed.

As described above, the formation of the amorphous dielectric film 30 and the annealing 32 are performed at the same or substantially the same temperature; instead, parameters, such as the pressure, the concentration of activated vapor containing oxygen and the flow rate and pressure of $O_2$ gas that may be properly controlled. For this reason, additional time is not required to stabilize the temperature of the chamber, thereby increasing the throughput. Further, deposition characteristics such as step coverage and deposition rate and electrical characteristics such as leakage current characteristics can be enhanced.

The amorphous dielectric film 30 may be formed to a desired thickness, e.g., 100 Å, by the method described with reference to FIG. 1, and then, the annealing 32 described with reference to FIG. 2 may be performed on the amorphous dielectric film 30. Additionally, referring to FIGS. 1 and 2, the formation of amorphous dielectric film 30 and the annealing 32 can be repeated more than once to form a dielectric film at a desired thickness. For instance, in order to obtain a dielectric film of 100 Å thickness, an amorphous dielectric film 30 having a thickness of 10 Å may be formed, and the annealing 32 is performed thereon. Then, other amorphous dielectric film having a thickness of 10 Å may be formed on the formed amorphous dielectric film 30 and the annealing 32 is performed thereon. This process is repeated a number of times until a dielectric film having the desired thickness of 100 Å is obtained.

Referring to FIG. 3, a thermal treatment 34 may be applied to the amorphous dielectric film 30, on which the annealing 32 is performed, at a higher temperature than the crystallization temperature of a tantalum pentoxide film, thereby forming a crystallized dielectric film 30a. If the amorphous dielectric film 30 is formed of an amorphous tantalum pentoxide film, the amorphous dielectric film 30 is heated at about 720–750° C. to form the crystallized dielectric film 30a.

Figure 4:
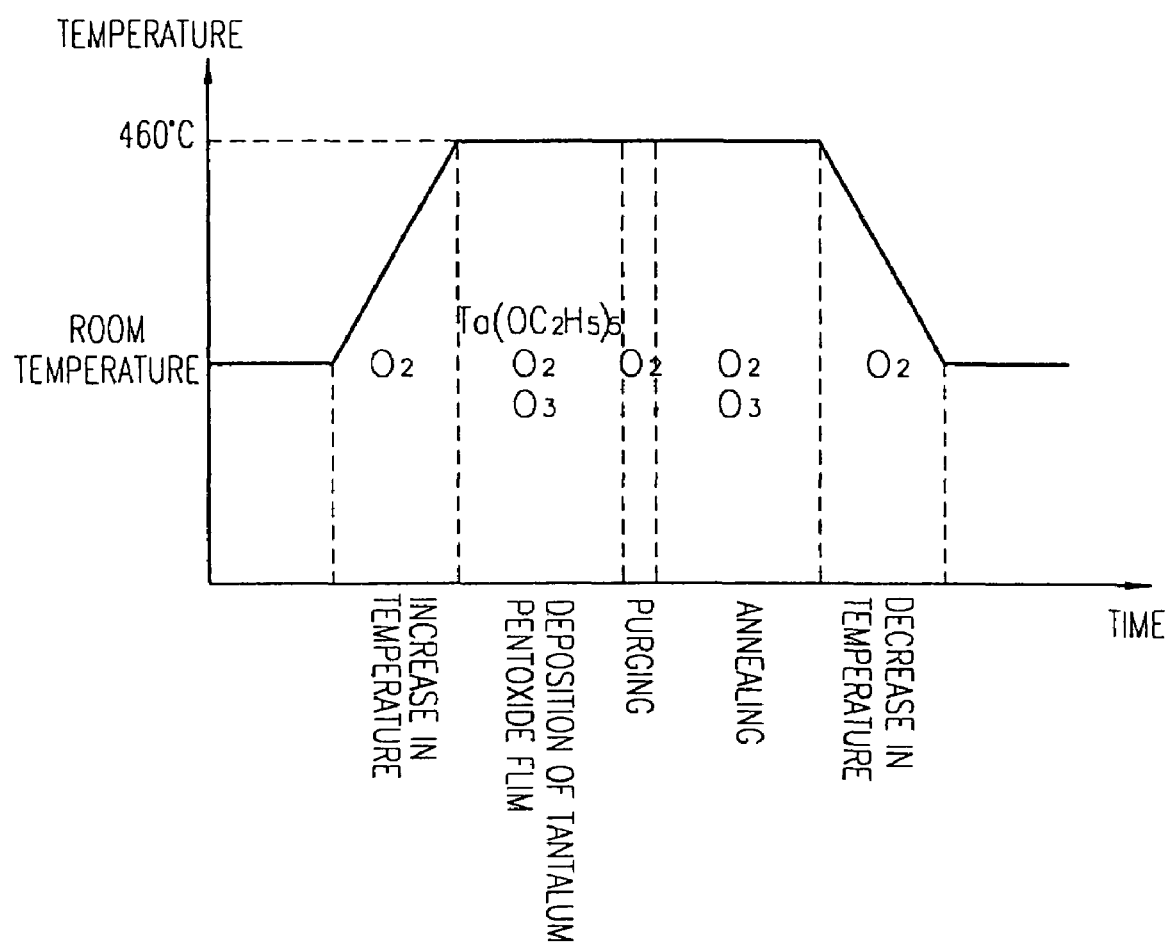
FIG. 4 is a graph showing variations in temperature according to processing time in a method of forming a tantalum pentoxide film according to at least one embodiment of the present invention.

FIG. 4 is a graph illustrating variations in temperature according to processing time when a tantalum pentoxide film is formed according at least one embodiment of the present invention. Referring to FIG. 4, before forming a tantalum pentoxide film, the temperature in the chamber is raised to a first temperature. At this time, $O_2$ gas is preferably first supplied to the chamber to reduce the possibility of a rapid change in the pressure of the chamber. Once the temperature of the chamber has been raised to a desired temperature, e.g., about 460° C., a wafer is loaded in the chamber, and the deposition of a tantalum pentoxide film, the purging of the chamber, and annealing using $O_3$ are performed, while the temperature of the chamber is maintained constant or substantially constant. Thereafter, the temperature of the chamber is lowered and the wafer is removed from the chamber. At this time, $O_2$ gas may be supplied to the chamber so that the possibility of a rapid change in the pressure in the chamber can be reduced.

Figure 5:
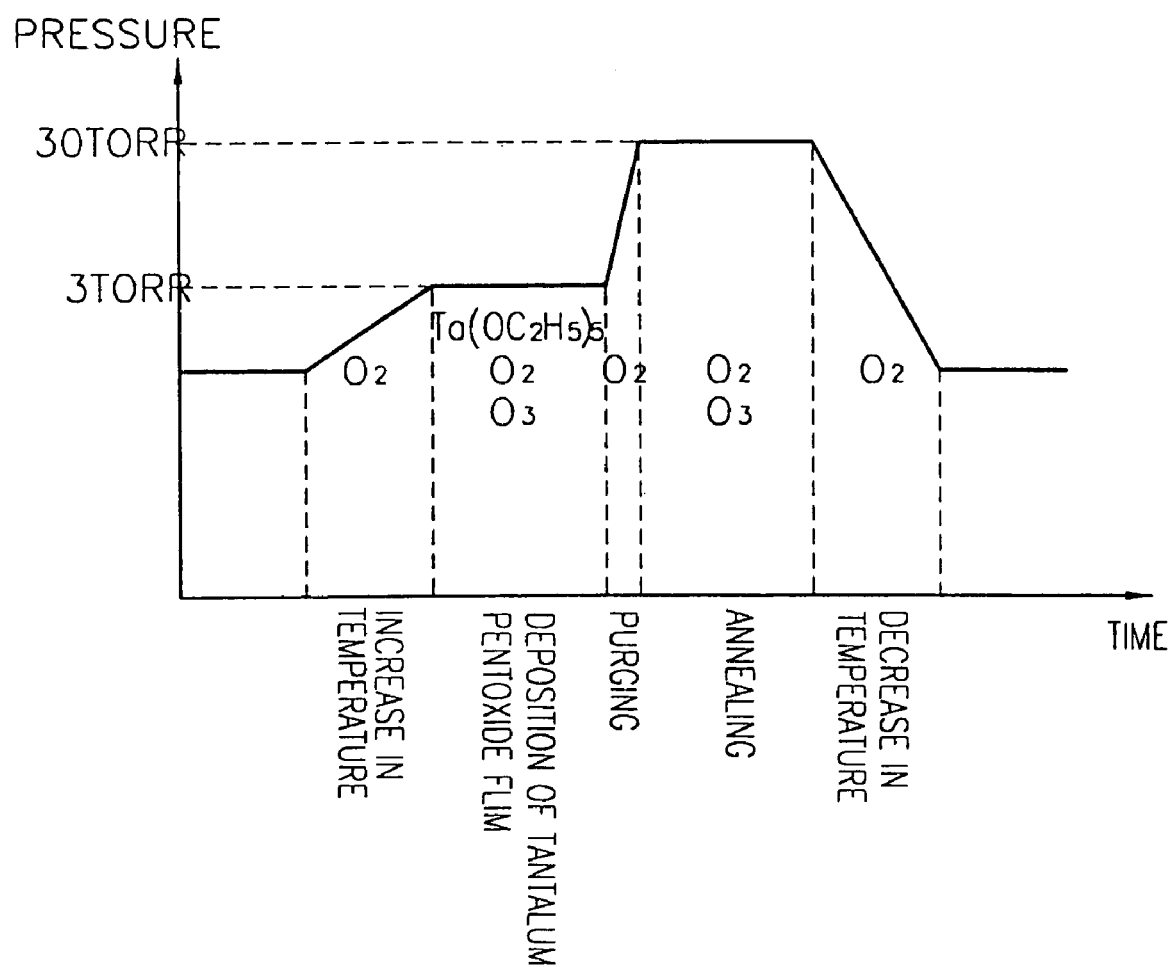
FIG. 5 is a graph showing variations in pressure according to processing time in a method of forming a tantalum pentoxide film according to at least one embodiment of the present invention.

FIG. 5 is a graph showing variations in the pressure of a chamber according to processing time when a tantalum pentoxide film is formed according to at least one embodiment of the present invention.

Figure 6:
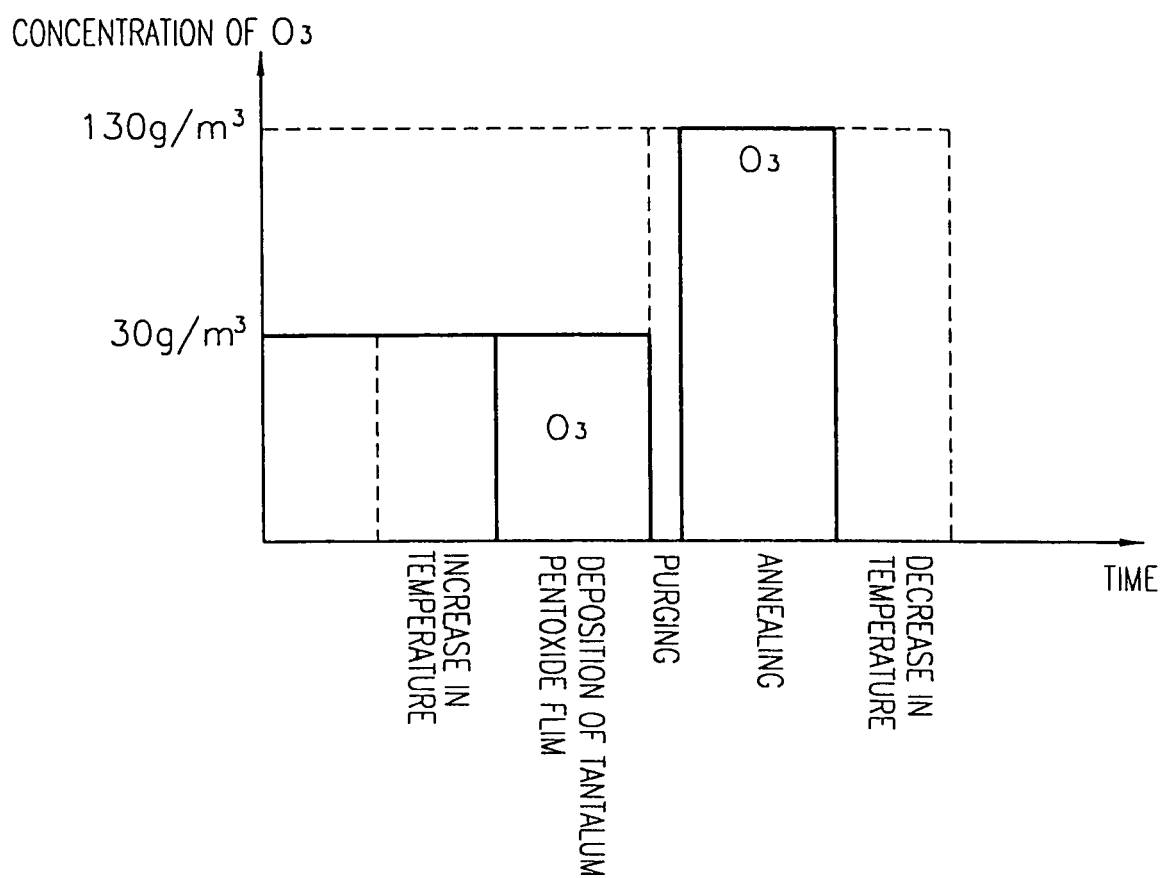
FIG. 6 is a graph showing variations in the concentration of $O_3$ according to processing time in a method of forming a tantalum pentoxide film according to at least one embodiment of the present invention.

FIG. 6 is a graph showing a variation in the concentration of $O_3$ used as activated vapor containing oxygen when a tantalum pentoxide film is formed according to at least one embodiment of the present invention.

It is noted that the principles illustrated by FIGS. 4–6 with respect to tantalum pentoxide films may also be applied the other types of films mentioned herein, as would be evident to one ordinary skill in the art, when presented with the discussion above regarding tantalum pentoxide films.

In a method of forming a tantalum pentoxide film according to at least one embodiment of the present invention, it is possible to form a tantalum pentoxide film having a desired thickness by repeatedly depositing a tantalum pentoxide film, purging of a chamber, and annealing a desired number of times.

Figure 7:
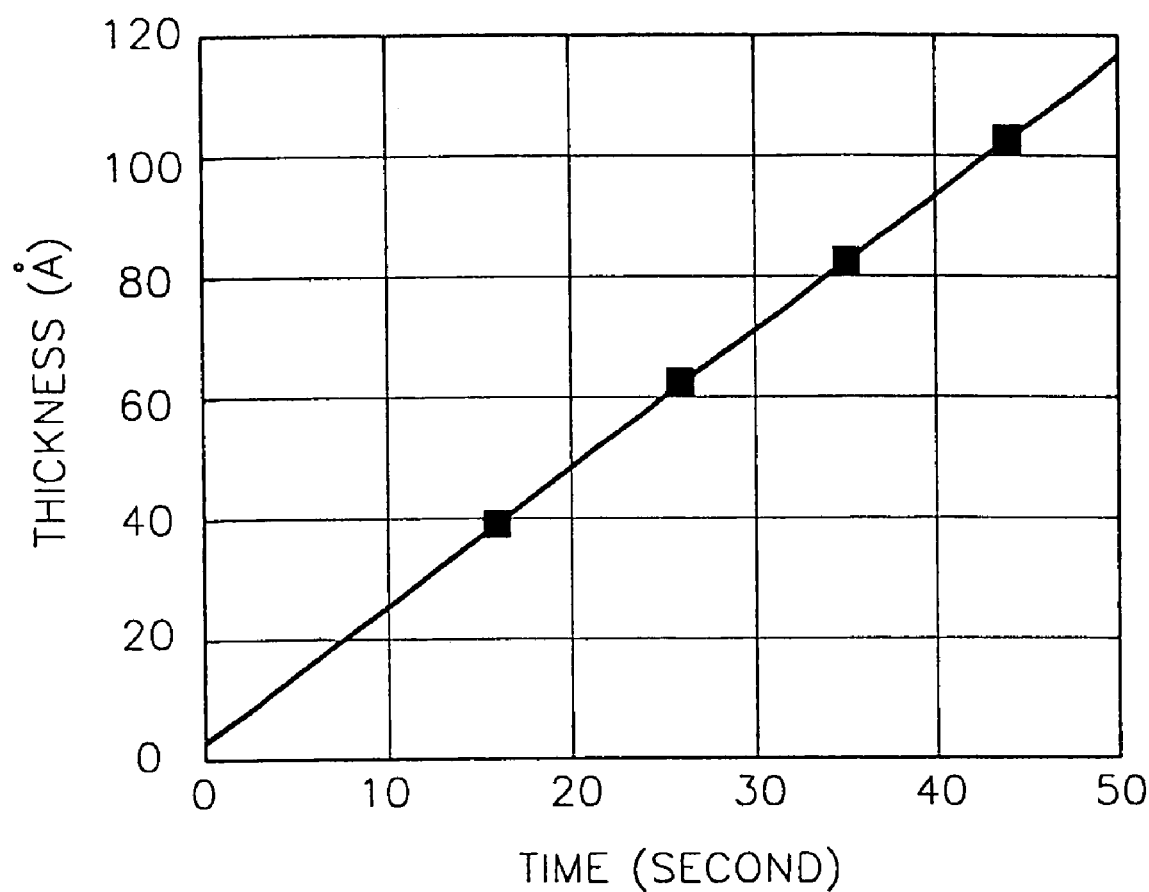
FIG. 7 is a graph showing variations in the thickness of a tantalum pentoxide film according to deposition time in a method of forming the tantalum pentoxide film according to at least one embodiment of the present invention.

FIG. 7 is a graph showing variations in the thickness of a tantalum pentoxide film according to deposition time in a method of forming the tantalum pentoxide film according to at least one embodiment of the present invention. From FIG. 7, it is noted that the tantalum pentoxide film can be stably deposited by supplying all of a Ta source, $O_2$ gas, and activated $O_3$ gas to a chamber once.

According to at least one embodiment of the present invention, a dielectric film composed of a metal oxide may be obtained by supplying a metal source, $O_2$ gas, and activated vapor containing oxygen in a chamber all at once to form a metal oxide film, and then annealing the amorphous metal oxide film in the same chamber without a change in temperature, i.e., in situ, under activated vapor atmosphere containing oxygen to supplement oxygen deficiency in the amorphous metal oxide film. For this reason, no additional time is required to stabilize the temperature of the chamber during the deposition of an amorphous dielectric film and a subsequent annealing, thereby raising throughput. Also, during the deposition of the amorphous dielectric film and the subsequent annealing, it is possible to improve deposition characteristics such as step coverage and deposition rate and electric characteristics such as leakage current characteristics by appropriately controlling the concentration of activated vapor containing oxygen and the flow rate and pressure of $O_2$ gas.

While the present invention has been particularly shown and described with reference to the preferred embodiments thereof, the present invention is not restricted to the above embodiments. It is noted that many of the principles described above with respect to tantalum pentoxide films may also be applied the other types of films mentioned herein, as would be evident to one ordinary skill in the art, when presented with the discussion above regarding tantalum pentoxide films.

What is claimed is:

1. A method of forming a tantalum pentoxide film comprising:
   forming an amorphous tantalum pentoxide film on a substrate in a chamber in which an activated vapor atmosphere containing oxygen is maintained, using a Ta source and $O_2$ gas at a deposition temperature of at least 380° C.;
   purging the chamber; and
   annealing the amorphous tantalum pentoxide film in the chamber in-situ with the formation of the amorphous pentoxide film in an oxygen atmosphere at an annealing temperature that is equal to or greater than the deposition temperature and below a crystallization temperature of tantalum pentoxide.

2. The method of claim 1, wherein the activated vapor atmosphere containing oxygen includes at least one of $O_3$, UV—$O_3$, $O_2$ plasma, $O_3$ plasma and $N_2O$ plasma.

3. The method of claim 1, wherein the Ta source includes at least one of $Ta(OC_2H_5)_5$ and $Ta(OC_2H_5)_4OCHCH_2N(CH_3)_2$.

4. The method of claim 1, wherein during the annealing, the oxygen atmosphere includes at least one of $O_3$, UV—$O_3$, $O_2$ plasma, $O_3$ plasma and $N_2O$ plasma.

5. The method of claim 4, wherein a concentration of the oxygen atmosphere during the annealing is the same or larger than a concentration of the activated vapor atmosphere containing oxygen used when the amorphous tantalum pentoxide film is formed.

6. The method of claim 4, wherein during the annealing, $O_2$ gas and the oxygen atmosphere are supplied to the chamber.

7. The method of claim 4, wherein the annealing temperature is 380–520° C.

8. The method of claim 1, wherein the deposition temperature during the formation of the amorphous tantalum pentoxide film and the annealing temperature are substantially the same temperature.

9. The method of claim 1, wherein the annealing is performed while maintaining a vacuum state of the chamber after the amorphous tantalum pentoxide film is formed.

10. The method of claim 1, wherein a pressure during the annealing is higher than a pressure during the forming of the amorphous tantalum pentoxide film.

11. The method of claim 1, wherein the formation of the amorphous tantalum pentoxide film is performed at a pressure of 0.1–10 Torr.

12. The method of claim 1, wherein the annealing is performed at a pressure of 0.1–50 Torr.

13. The method of claim 1, wherein during the purging of the chamber, $O_2$ gas is supplied to the chamber.

14. A method of forming a dielectric film comprising:
    forming a metal oxide film on a substrate while the substrate is exposed to a mixture including a first activated vapor containing oxygen, a metal organic precursor and $O_2$ gas; and
    annealing the metal oxide film in-situ with the formation of the metal oxide film while the substrate is exposed to a second activated vapor containing oxygen.

15. The method of claim 14, wherein:
    during the annealing, the second activated vapor containing oxygen and $O_2$ gas are supplied to the substrate.

16. The method of claim 14, wherein:
    the annealing is performed at a temperature of 380–520° C.

17. The method of claim 14, wherein:
    the formation of the metal oxide film and the annealing are performed at substantially the same temperature.

18. The method of claim 14, wherein:
    the formation of the metal oxide film and the annealing are performed in the same chamber while maintaining a vacuum state within the chamber.

19. The method of claim 14, wherein:
    the annealing is performed at a higher pressure greater than a pressure at which the metal oxide film is formed.

20. The method of claim 14, wherein:
    during the annealing, a concentration of the activated vapor is greater than a concentration of the activated vapor used when the metal oxide film was formed.

21. A method of forming a dielectric film comprising:
    forming a metal oxide film on a substrate in a chamber by supplying at least a metal organic precursor and an activated vapor at a formation temperature;
    purging the chamber; and
    annealing the metal oxide film in the chamber at substantially the same temperature as the formation temperature used when forming the metal oxide film.

22. A method of forming a dielectric film comprising:
    forming a metal oxide film on a substrate in a chamber by supplying at least a metal organic precursor and an activated vapor, under a first pressure, a first vapor concentration, and a first vapor flow rate;
    purging the chamber; and
    annealing the metal oxide film in the chamber under a second pressure, a second vapor concentration, and a second vapor flow rate, wherein at least one of the second pressure, second vapor concentration, and second vapor flow rate is different from the first pressure, the first vapor concentration, and the first vapor flow rate used to form the metal oxide film.

* * * * *